(12) United States Patent
Lee

(10) Patent No.: US 9,406,723 B2
(45) Date of Patent: Aug. 2, 2016

(54) ORGANIC LIGHT EMITTING DIODE DISPLAY AND METHOD FOR MANUFACTURING THE SAME

(71) Applicant: Samsung Display Co., Ltd., Yongin, Gyeonggi-Do (KR)

(72) Inventor: Sang Shin Lee, Hwaseong-si (KR)

(73) Assignee: Samsung Display Co., Ltd., Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/256,190

(22) Filed: Apr. 18, 2014

(65) Prior Publication Data

US 2015/0102297 A1    Apr. 16, 2015

(30) Foreign Application Priority Data

Oct. 10, 2013 (KR) .......................... 10-2013-0120692

(51) Int. Cl.
*H01L 27/32* (2006.01)
*G09G 3/32* (2016.01)
*G09G 3/20* (2006.01)

(52) U.S. Cl.
CPC .......... *H01L 27/3218* (2013.01); *G09G 3/3233* (2013.01); *G09G 3/2003* (2013.01); *G09G 3/3208* (2013.01); *G09G 2300/0452* (2013.01); *G09G 2300/0465* (2013.01)

(58) Field of Classification Search
CPC ... H01L 27/3206; H01L 27/326; H01L 51/56; H01L 27/3218; H01L 27/3216; H01L 27/3211; H01L 27/3246; H01L 51/5203; H01L 51/0003; G09G 3/3208; G09G 3/2003; G09G 3/3216; G09G 3/3225; G09G 3/3607; G09G 3/3614

USPC ................. 257/40; 438/35, 29; 345/82, 694; 315/169.3, 495; 313/503, 500, 504, 313/505, 506

See application file for complete search history.

(56) References Cited

U.S. PATENT DOCUMENTS

| 5,367,390 A | * | 11/1994 | Scheffer ............ G02F 1/133512 349/111 |
| 8,354,789 B2 | | 1/2013 | Kim et al. |
| 2004/0108818 A1 | * | 6/2004 | Cok et al. .................. 315/169.3 |
| 2009/0195144 A1 | * | 8/2009 | Kitabayashi ........ H01L 27/3246 313/503 |

(Continued)

FOREIGN PATENT DOCUMENTS

JP    2008-135333 A    6/2008
KR    10-0579048 B1    5/2006

(Continued)

*Primary Examiner* — David Vu
*Assistant Examiner* — Mouloucoulaye Inoussa
(74) *Attorney, Agent, or Firm* — Robert E. Bushnell, Esq.

(57) ABSTRACT

An organic light emitting diode display having a pixel array structure capable of maximizing space use, and a method for manufacturing the same. The organic light emitting diode display includes pixels of a first color, pixels of a second color, and pixels of a third color, each having a longitudinal direction that extends along one of two diagonals of the display and not along a row or a column direction. Furthermore, each of the pixels are arranged in pairs, each pixel of each pair being of a same color and being arranged near each other, extending in a same direction, and being symmetrical about a vertex of a unit area. Each pair of pixels is produced by deposition of an emission material into a single opening in a fine metal mask, leading to improved aperture ratio and improved use of space.

18 Claims, 17 Drawing Sheets

(56) References Cited

U.S. PATENT DOCUMENTS

2009/0262048 A1   10/2009   Park et al.
2012/0139965 A1*   6/2012   Yang .................... G09G 3/3225
                                                               345/690
2013/0234917 A1*   9/2013   Lee ..................... H01L 27/3218
                                                               345/82

FOREIGN PATENT DOCUMENTS

| KR | 10-2008-0088737 A | 10/2008 |
| KR | 10-0924142 B1 | 10/2009 |
| KR | 10-1189025 B1 | 9/2012 |
| KR | 10-2013-0101874 A1 | 9/2013 |

* cited by examiner

ORGANIC LIGHT EMITTING DIODE DISPLAY AND METHOD FOR MANUFACTURING THE SAME

CLAIM OF PRIORITY

This application claims priority to and the benefit of Korean Patent Application No. 10-2013-0120692 filed in the Korean Intellectual Property Office on Oct. 10, 2013, the entire contents of that are incorporated herein by reference.

BACKGROUND OF THE INVENTION

1. Field of the Invention

The present invention relates to an organic light emitting diode display and a method for manufacturing the same, and more particularly, to an organic light emitting diode display having a pixel array structure capable of maximizing space use, and a method for manufacturing the same.

2. Description of the Related Art

An organic light emitting diode display includes two electrodes and an emission layer disposed therebetween, and forms excitons by combining electrons injected from one electrode with holes injected from the other electrode at the emission layer, and emits light by allowing the excitons to emit energy. The organic light emitting diode (OLED) display is a self-light emitting type display device and therefore does not need a separate light source such as a backlight. Therefore, the organic light emitting diode display is advantageous in terms of power consumption and has excellent response speed, viewing angle, and contrast ratio.

Meanwhile, the organic light emitting diode display includes a plurality of pixels, such as red pixels, blue pixels, green pixels, and white pixels, and may display a full color by combining these pixels. Each pixel includes an organic light emitting element and a plurality of thin film transistors for driving the organic light emitting element. The pixels may be arrayed in various forms, and for example, the pixels of at least one primary color may be arrayed in a stripe type in a row or a column direction.

The organic light emitting element includes an anode and a cathode as two electrodes, and an organic emission layer disposed therebetween. The organic emission layer may emit light of three primary colors such as red, green, and blue and other various colors.

The organic emission layer may be deposited using a shadow mask such as a fine metal mask (FMM). The fine metal mask includes a plurality of openings having substantially the same shape and size as the organic emission layer to be formed, and may form the plurality of organic emission layers displaying the same color at a time by depositing the organic emission material through the openings.

The above information disclosed in this Background section is only for enhancement of understanding of the background of the invention and therefore it may contain information that does not constitute prior art as per 35 U.S.C. §102, either prior to or after the America Invents Act (AIA).

SUMMARY OF THE INVENTION

When the pixels of at least one primary color are arrayed in the stripe type in the row or column direction, a gap between the pixels is short and the opening of the fine metal mask is long and narrow, thereby causing deterioration in deposition reliability using the fine metal mask. When the gap between the pixels is formed to be expanded so as to improve the deposition reliability, an aperture ratio of the pixel may deteriorate. Further, the representation capability of high resolution may deteriorate, and the size of the display panel may be restricted.

The present invention has been made in an effort to secure a sufficient gap between pixels by optimizing a pixel array to increase an aperture ratio of a pixel while facilitating manufacturing using a fine metal mask.

Further, the present invention has been made in an effort to easily implement high resolution of an organic light emitting diode display and easily expand a size of a display panel.

According to one aspect of the present invention, there is provided an organic light emitting diode display that includes a plurality of pixels of a first color, a plurality of pixels of a second color, and a plurality of pixels of a third color arrayed based on a plurality of virtual unit areas arranged in a matrix, the matrix also including a plurality of vertexes, each vertex being arranged at where corners of adjoining unit areas meet, wherein each unit area may have a rectangular shape having a plurality of sides, each of the sides being approximately parallel to one of a row direction and a column direction, wherein a first of the pixels of the first color may be arranged in a first of the unit areas and being arranged to be closest to a first vertex that is one of two vertexes that a first diagonal line extending in a first diagonal direction of the first of the unit areas intersects, and wherein a second of the pixels of the first color may be arranged in a second of the unit areas, the second of the unit areas may be adjacent to the first of the unit areas in the first diagonal direction, wherein the first vertex may be arranged in between the first and the second of the pixels of the first color.

The first of the pixels of the first color may be a polygon that is longer in the first diagonal direction than in any other direction. The first and the second of the pixels of the first color that share the first vertex may be symmetrical to each other with respect to the shared first vertex.

A first of the pixels of the second color may be arranged in a third of the unit areas and being arranged closest to a second vertex that is one of two vertexes that a second diagonal line of the third of the unit areas intersects, the second diagonal line may extend in a second diagonal direction that is a different from the first diagonal direction, and a second of the pixels of the second color may be arranged in a fourth of the unit areas, the fourth of the unit areas may be adjacent to the third of the unit areas in the second diagonal direction, wherein the second vertex may be arranged in between the first and the second of the pixels of the second color. The second of the pixels of the second color may be a polygon that is longer in the second diagonal direction than in any other direction. The first and the second of the pixels of the second color that share the second vertex may be symmetrical to each other with respect to the shared second vertex.

A first pixel of the third color may be arranged in the first of the unit areas and may be adjacent to a third vertex that is one of two vertexes that a second diagonal line of the first of the unit areas intersects, the second diagonal line may extend in a second diagonal direction that is different from the first diagonal direction. The first of the pixels of the third color may be a polygon that is longer in the first diagonal direction than in any other direction. Longitudinal directions of differing pixels of the third color arranged in unit areas that are adjacent in the row direction or the column direction may be different from each other. The first of the pixels of the third color may be a regular polygon that has a side substantially parallel the first diagonal direction. A second of the pixels of the third color may be arranged in a third of the unit areas while being adjacent to the first of the pixels of the third color while sharing a same third vertex, the first and the second of the pixels of the third color may be symmetrical to each other with respect to the shared third vertex.

At least one of a distance between two of the pixels of the first color that are adjacent to each other in a row direction or a column direction, a distance between two of the pixels of the second color that are adjacent to each other in a row direction or a column direction, and a distance between two of the pixels of the third color that are adjacent to each other in a row direction or a column direction may be approximately 100 µm or less. One of the pixels of the third color and one of the pixels of either the first or the second color may be arranged in each of the unit areas, wherein the pixels of the third color is are green pixels. A length of each of the pixels of the third color may be approximately half of that of each of the pixels of the first color and the pixels of the second color.

According to another aspect of the present invention, there is provided a method for manufacturing an organic light emitting diode display, including forming pixel electrodes on an insulating substrate for each of a plurality of pixels of a first color, for each of a plurality of pixels of a second color, and for each of a plurality of pixels of a third color, depositing a first emission layer on the pixel electrodes of the pixels of the first color by using a first fine metal mask, and forming a common electrode on the first emission layer, the first fine metal mask may includes a first opening corresponding to a pair of the pixels of the first color that are adjacent to each other. The pixels of the first color, the pixels of the second color, and the pixels of the third color may be arranged based on a plurality of virtual unit areas that are arranged in a matrix, the matrix may also including a plurality of vertexes, each of the vertexes may be arranged where corners of adjoining unit areas meet. Each of the unit areas may have a rectangular shape having a plurality of sides, each of the sides may be approximately parallel to one of a row direction and a column direction. Each of the pixels of the first color may be arranged in pairs, wherein a first pixel and a second pixel each pair of pixels of the first color may share a same vertex and may be arrayed on a first diagonal line that extends in a first diagonal direction. The first pixel of the pair of pixels of the first color may be arranged in a first of the unit areas, and may be arranged closer to a first vertex that is one of two vertexes that the first diagonal line of the first unit area intersects. The second pixel of the pair of pixels of the first color may be arranged in a second of the unit areas, the second of the unit areas may be adjacent to the first of the unit areas in the first diagonal direction.

The method may also include depositing a second emission layer on the pixel electrodes of the pixels of the second color by using a second fine metal mask. The second fine metal mask may include a second opening corresponding to a pair of the second pixels that are adjacent to each other. Each of the pixels of the second color may be arranged in pairs. A first pixel and a second pixel each pair of pixels of the second color may share a same vertex and may be arrayed on a second diagonal line that extends in a second diagonal direction that is different from the first diagonal direction. The first pixel of the pair of pixels of the second color may be arranged in a third of the unit areas, and may be arranged closer to a second vertex that is one of two vertexes that the second diagonal line of the third unit area intersects. The second pixel of the pair of pixels of the second color may be arranged in a fourth of the unit areas, the fourth of the unit areas being adjacent to the third of the unit areas in the second diagonal direction.

The method may also include depositing a third emission layer on the pixel electrodes of the pixels of the third color by using a third fine metal mask. The third fine metal mask may include a third opening corresponding to a pair of the pixels of the third color that are adjacent to each other. A first of the pixels of the third color may be arranged in the first of the unit areas and may be adjacent to a third vertex that is one of two vertexes that a second diagonal line extending in the second diagonal direction within the first of the unit areas intersects.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in that like reference symbols indicate the same or similar components, wherein.

DETAILED DESCRIPTION OF THE INVENTION

Figure 1:
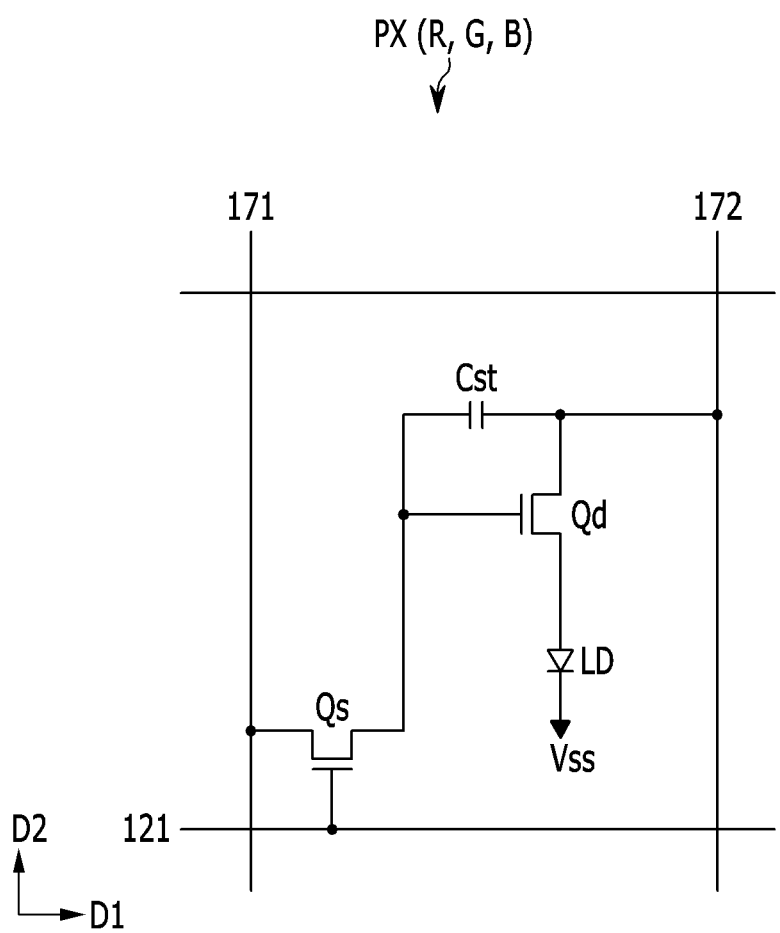
FIG. 1 is a circuit diagram of one pixel of an organic light emitting diode display according to an exemplary embodiment of the present invention.

The present invention will be described more fully hereinafter with reference to the accompanying drawings, in that exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

First, the organic light emitting diode display according to an exemplary embodiment of the present invention will be described with reference to FIG. 1. FIG. 1 is a circuit diagram of one pixel of an organic light emitting diode display according to an exemplary embodiment of the present invention.

Referring to FIG. 1, the organic light emitting diode display according to the exemplary embodiment of the present invention includes a plurality of signal lines 121, 171, and 172, and a pixel PX connected thereto. The pixel PX is a unit that displays an image and is an area thereof. One pixel PX includes a switching transistor Qs, a driving transistor Qd, a storage capacitor Cst, and an organic light emitting element LD. The pixel PX may display three primary colors such as red (R), green (G), and blue (B), or any one of primary colors formed of other colors. According to the exemplary embodiment of the present invention, an example of the primary colors may include red (R), green (G) and blue (B), but the kind and number of primary colors are not limited thereto, such as for example cyan (C), magenta (M) and yellow (Y). Further, the pixel PX displaying each primary color is represented by the same sign as the primary color.

A signal line includes a scanning signal line 121 that transfers gate signals (or scanning signals), a data line 171 that transfers data signals, a driving voltage line 172 that transfers a driving voltage, and the like. The scanning signal lines 121 approximately extend in a row direction D1 and are approximately parallel each other, and the data lines 171 approximately extend in a column direction D2 and are approximately parallel each other. FIG. 1 illustrates that the driving voltage lines 172 approximately extend in the column direction D2, but the driving voltage lines 172 may instead extend in the row direction D1, or the column direction D2 or may also be formed in a net configuration.

The switching transistor Qs includes a control terminal, an input terminal, and an output terminal, the control terminal being connected to the scanning signal line 121, the input terminal being connected to the data line 171, and the output terminal being connected to the driving transistor Qd. The switching transistor Qs transfers the data signal received from the data line 171 to the driving transistor Qd in response to the scanning signal received from the scanning signal line 121.

The driving transistor Qd also has a control terminal, an input terminal, and an output terminal, the control terminal being connected to the switching transistor Qs, the input terminal being connected to the driving voltage line 172, and the output terminal being connected to the organic light emitting element LD. The driving transistor Qd transfers an output current having a magnitude that varies depending upon a voltage applied between the control terminal and the output terminal.

The storage capacitor Cst is connected between the control terminal and the input terminal of the driving transistor Qd. The storage capacitor Cst charges the data signal applied to the control terminal of the driving transistor Qd, and maintains the charged data signal even after the switching transistor Qs is turned off.

The organic light emitting element LD is, for example, an organic light emitting diode (OLED), and includes an anode that is connected to the output terminal of the driving transistor Qd and a cathode that is connected to a common voltage Vss. The organic light emitting element LD displays an image by emitting light having an intensity that varies depending on the output current of the driving transistor Qd. The organic light emitting element LD may include an organic material that uniquely emits light of any one of the primary colors, such as three primary colors of red, green, and blue, and the organic light emitting diode display displays a desired image as a spatial sum of these colors.

The switching transistor Qs and the driving transistor Qd are n-channel field effect transistors (FETs), but at least one of them may instead be a p-channel field effect transistor. Further, the connection relationship among the transistors Qs and Qd, the storage capacitor Cst, and the organic light emitting element LD may be changed.

Figure 2:
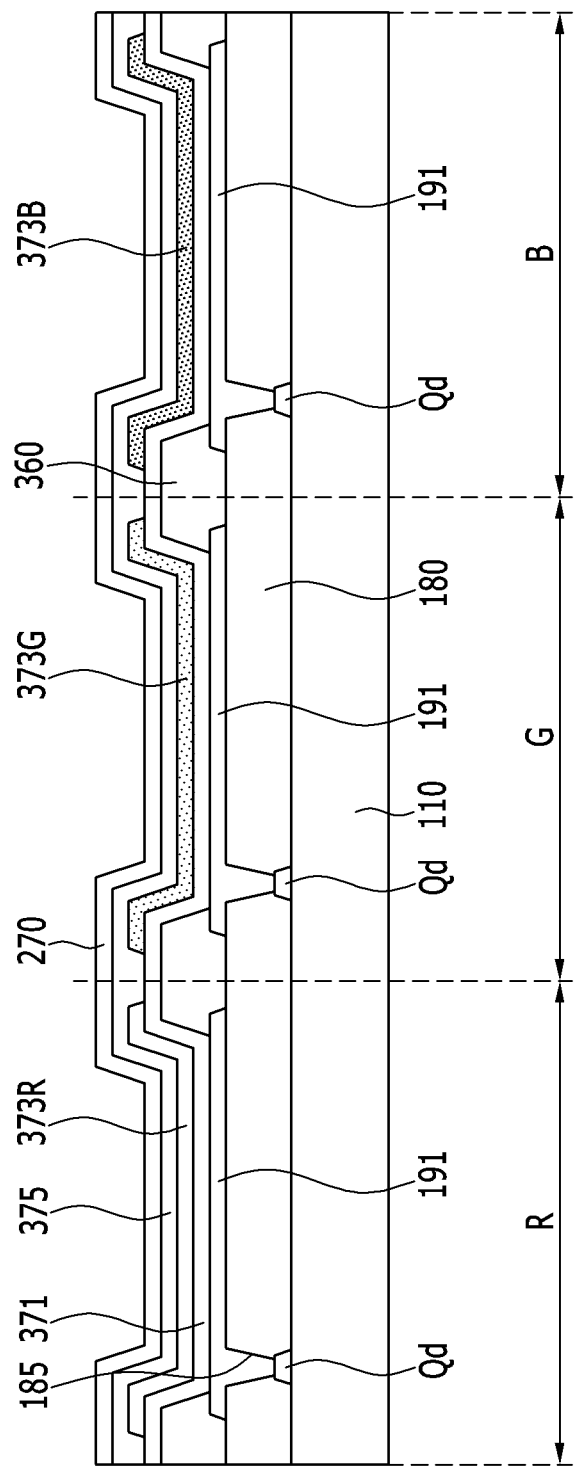
FIG. 2 is a cross-sectional view of an organic light emitting diode display according to the exemplary embodiment of the present invention.

Next, one example of the section structure of the organic light emitting diode display according to the exemplary embodiment of the present invention will be described with reference to FIGS. 1 and 2 described above. FIG. 2 is a cross-sectional view of the organic light emitting diode display according to the exemplary embodiment of the present invention.

Referring to FIG. 2, the plurality of driving transistors Qd are disposed on an insulating substrate 110 that may be made of transparent glass or plastic, and the like. Although not illustrated, the plurality of signal lines (not illustrated), the plurality of switching transistors (not illustrated), and the like are further disposed on the insulating substrate 110.

A passivation layer 180 that may be made out of an inorganic material or an organic material is disposed on the driving transistor Qd. The passivation layer 180 includes a contact hole 185 that exposes the output terminal of the driving transistor Qd. A plurality of pixel electrodes 191 that are connected to the output terminal of the driving transistor Qd of each R, G, and B pixels through the contact hole 185 are disposed on the passivation layer 180. A pixel defining layer (referred to as a barrier rib) 360 having a plurality of openings may be disposed on the pixel electrode 191 and the passivation layer 180. The opening of the pixel defining layer 360 that exposes the pixel electrode 191 may define each pixel area. The pixel defining layer 360 may also be omitted.

An emission member is disposed on the pixel defining layer 360 and on the pixel electrode 191. The emission member may include a lower organic common layer 371, a plurality of emission layers 373R, 373G, and 373B, and an upper organic common layer 375 that are sequentially stacked. The lower organic common layer 371 may include, for example, at least one of a hole injecting layer and a hole transport layer that are sequentially stacked. The lower organic common layer 371 may also be formed over the entire surface of a display area where pixels PX are disposed, and may instead be only formed separately in each pixel PX area.

Each of the emission layers 373R, 373G, and 373B may be disposed on the pixel electrode 191 of the corresponding pixel PXs. The emission layers 373R, 373G, and 373B may be made out of an organic material that uniquely emits light of the primary colors such as red, green, and blue.

The upper organic common layer 375 may include, for example, at least one of an electron transport layer and an electron injecting layer that are sequentially stacked. The upper organic common layer 375 may also be formed over the entire surface of the display area where the pixel PX are disposed, or instead be formed only in each pixel PX area.

The lower and upper organic common layers 371 and 375 are to improve an emission efficiency of the emission layers 373R, 373G, and 373B, and at least one of the lower and upper organic common layers 371 and 375 may also be omitted.

A common electrode 270 that transfers a common voltage is formed on the emission member. Any one of the pixel electrode 191 and the common electrode 270 includes a transparent conductive material, while the other thereof may include a semi-transparent or reflective conductive material. The pixel electrodes 191, the emission members, and the common electrodes 270 of each pixel PX form the organic light emitting element LD, and one of the pixel electrode 191 and the common electrode 270 becomes a cathode and the other thereof becomes an anode. An encapsulation layer (not illustrated) that encapsulates the emission member and the common electrode 270 to prevent moisture and/or oxygen from permeating from the outside may be further formed on the common electrode 270.

Next, the pixel PX array structure of the organic light emitting diode display of the first and second exemplary embodiments of the present invention will be described with reference to FIGS. 3 to 12.

FIGS. 3 to 6 each are plan views illustrating a pixel array structure for a virtual unit area of the organic light emitting diode display according to a first exemplary embodiment of the present invention, and FIGS. 7 to 10 each are plan views illustrating a pixel array structure for a virtual unit area of the organic light emitting diode display according to a second exemplary embodiment of the present invention. The virtual unit areas F3, F4, F5 and F6 of FIGS. 3 to 6 respectively form the display of FIG. 11, while the virtual unit areas F7, F8, F9 and F10 of FIGS. 7 to 10 respectively form the display of FIG. 12.

The primary colors that are represented by the pixel PX according to the exemplary embodiments of the present invention include a first color, a second color, and a third color, that are different from each other, and according to the exemplary embodiments of the present invention, the first color, the second color, and the third color may include red R, green G, and blue B respectively will be described by way of example. The pixel representing the red R is referred to as a red pixel R, the pixel representing the green G is referred to as a green pixel G, and the pixel representing the blue B is referred to as a blue pixel B.

Referring to FIGS. 3 to 10, the display area of the organic light emitting diode display according to the first and second exemplary embodiments of the present invention include a plurality of virtual unit areas UAs, in that the plurality of unit areas UA are arranged in a matrix form. Each of the unit areas UA may be approximately a rectangle having sides that extend in the row direction D1 and in the column direction D2. According to the first and second exemplary embodiments of the present invention, an example where each unit area UA is approximately a square will be described.

Diagonal directions of each unit area UA include a first diagonal direction D3 and a second diagonal direction D4 that intersect each other. In the case of the unit area UA that is a square, first and second diagonal directions D3 and D4 are orthogonal to each other, and the first and second diagonal directions D3 and D4 may form approximately 45° or 135° angle with respect to the row direction D1 and the column direction D2. Each unit area UA has four corners or vertexes V (see FIGS. 3 to 10). Each vertex V is where the corners of four unit areas UAs meet. At each vertex V, at least one of the diagonals D3 and D4 intercepts a corner at a perimeter of a unit area UA.

The pixels R, G, and B according to the exemplary embodiment of the present invention may each have a shape of a rectangle or a polygon that is longer in one direction than other directions. A side in a length direction of each of the pixels R, G, and B, that is, a long side may be approximately parallel the first diagonal direction D3 or the second diagonal direction D4. The shapes of the red pixel R, the green pixel G, and the blue pixel B may be the same as and different from each other.

Referring to FIGS. 3 to 6, FIGS. 3 to 6 illustrate unit areas F3, F4, F5 and F6 respectively. In FIGS. 3 to 6, the red pixel R is approximately parallel the first diagonal direction D3, and a central line in a long side direction of each red pixel R may be approximately arranged on the diagonal line d3 of the unit area UA. The blue pixel B is approximately parallel the second diagonal direction D4, and a central line in a long side direction of each blue pixel B may be approximately arranged on the diagonal line d4 of the unit area UA. Therefore, in the case of the unit area UA that is a square, a long side of the red pixel R and a long side of the blue pixel B may be perpendicular to each other.

Each unit area UA of FIGS. 3 to 12 includes four vertexes V where the diagonal lines d3 and d4 intercept the corners of the unit area UA. A central point of the red pixel R and the blue pixel B is positioned to be closer to any one of two vertexes on the diagonal line that either the red pixel R or the blue pixel B extends along. Further, since the red pixel R and the blue pixel B are disposed to be possibly close to the vertexes V of the unit areas UA, a short side or a long side of the red pixel R or the blue pixel B and a side of the unit area UA connected to the vertex may be close to or meet each other. A length of the long side of the red pixel R or the blue pixel B may be shorter than that of the diagonal line of the unit area UA. An area of each red pixel R may be the same as or different from that of each blue pixel B.

The green pixel G is disposed in approximately the same direction as the length direction of the red pixel R or the blue pixel B adjacent thereto within the same unit area UA. That is, the long side of the green pixel G may be parallel the long side of a one of the red pixel R or the blue pixel B that is disposed within the same unit area UA as the green pixel G.

The green pixel G is disposed to be close to any one of the two vertexes that meet the diagonal line that is perpendicular to the diagonal line at that the red pixel R or the blue pixel B is arranged upon. Further, since the green pixel G may be disposed to be close to a vertex V, a portion of the long side thereof may be close to or intercept a side of the unit area UA connected to the vertex V.

The green pixel G may be arrayed in different directions depending on the unit area UA. For example, as illustrated in FIGS. 3 to 6, the long side of the green pixel G that is disposed in the same unit area UA as the red pixel R may be parallel to the first diagonal direction D3, while the long side of the green pixel G that is disposed in the same unit area UA as the blue pixel B may be parallel to the second diagonal direction D4.

The area of the each green pixel G may be smaller than that of the red pixel R or the blue pixel B, and the length of the long side of the green pixel G may be shorter than that of the long side of the red pixel R or the blue pixel B. For example, the area or the length of the long side of each green pixel G may be approximately a half of the area or the length of the long side of the red pixel R or the blue pixel B, but is not limited thereto.

Referring now to FIGS. 7 to 10, the pixel array structure according to the second exemplary embodiment of the present invention is described and is substantially the same as the first exemplary embodiment illustrated in FIGS. 3 to 6 described above, with the exception that the longitudinal extending directions of the red pixel R and the blue pixel B may be opposite to that of the first exemplary embodiment of the present invention illustrated in FIGS. 3 to 6 described above. That is, the red pixel R is approximately parallel the second diagonal direction D4, and the second diagonal line d4 in the long side direction of each red pixel R may be approximately parallel to the second diagonal direction D3 of the unit area UA. The blue pixel B is approximately parallel the first diagonal direction D3, and the central line in the long side direction of each blue pixel B may be approximately arranged along the first diagonal line d3 of the unit area UA. As with the first embodiment of FIGS. 3 to 6 and 11, the second embodiment of FIGS. 7 to 10 and 12 have the long side of the red pixel R and the long side of the blue pixel B perpendicular to each other.

The green pixel G is disposed in approximately the same direction as the length direction of the adjacent red pixel R or blue pixel B within the same unit area UA. That is, the long side of the green pixel G may be approximately parallel the long side of the red pixel R or the blue pixel B that is disposed within the same unit area UA.

The green pixel G is disposed to be close to any one of the two vertexes that meet the diagonal line perpendicular to the diagonal line that the red pixel R or the blue pixel B extends along within the same unit area UA. Further, the green pixel G is disposed to be possibly close to the vertex adjacently disposed thereto, such that the section or the long side thereof may be close to or intercept the a portion of side of the UA in a vicinity of the vertex V.

The green pixel G may extend in different directions depending on the unit area UA. For example, as illustrated in FIGS. 7 to 10, the long side of the green pixel G that is disposed in the same unit area UA as the red pixel R, may be parallel the second diagonal direction D4, while the long side of the green pixel G that is disposed in the same unit area UA as the blue pixel B may be parallel the first diagonal direction D3.

Figure 11:
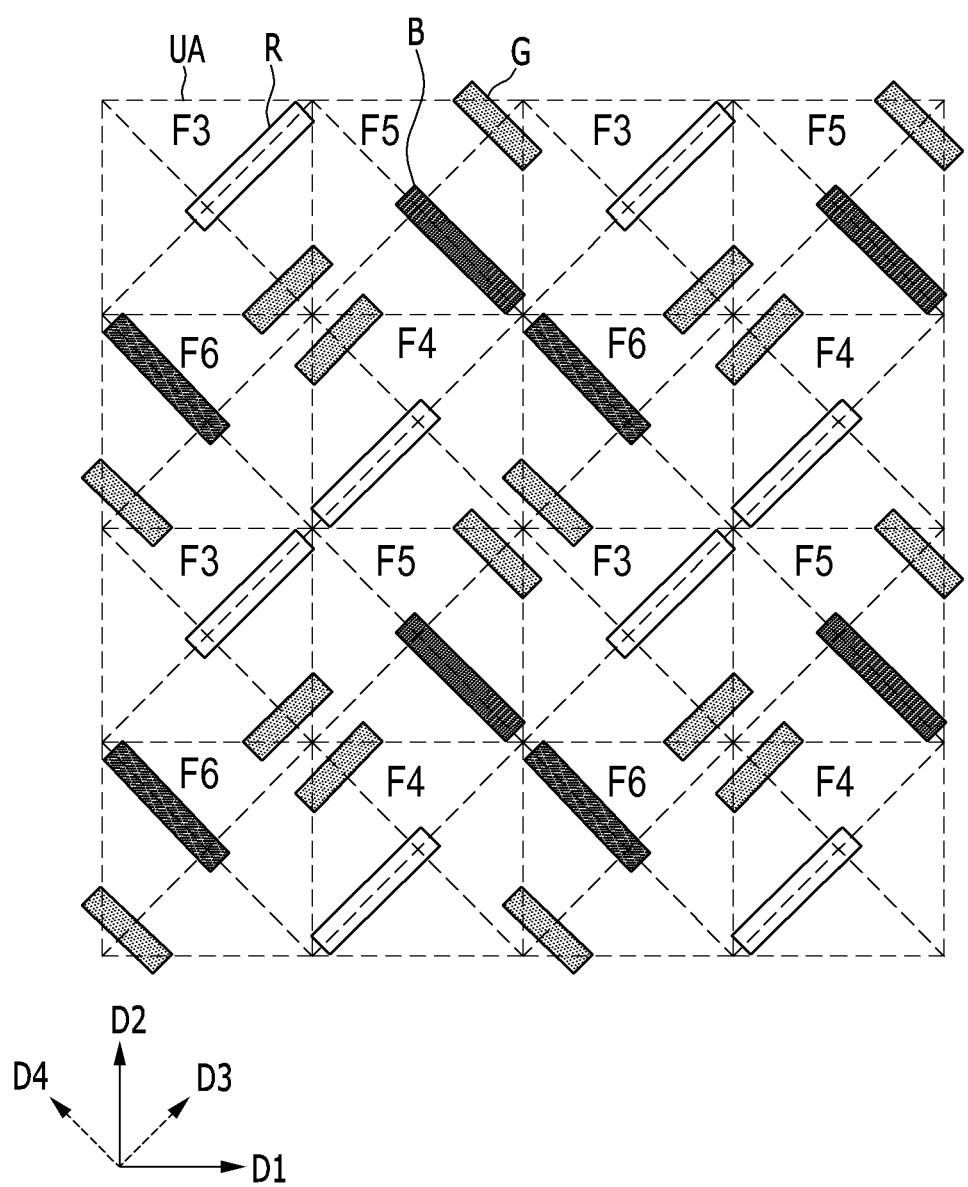
FIG. 11 is a plan view illustrating the pixel array structure of the organic light emitting diode display according to the first exemplary embodiment of the present invention using the unit areas of FIGS. 3 to 6.

Next, the pixel array structure of the organic light emitting diode display according to the first exemplary embodiment of the present invention will be described in more detail with reference to FIG. 11, along with FIGS. 3 to 6. FIG. 11 is a plan view of the pixel array structure of the organic light emitting diode display according to the first exemplary embodiment of the present invention, and is composed of unit areas F3, F4, F5 and F6 illustrated in FIGS. 3 to 6. The pixel array structure according to the first exemplary embodiment of the present invention is a PenTile™ pixel array structure and has the minimum number of pixels PXs and may represent the maximum resolution.

Referring to FIG. 11, the display area of the organic light emitting diode display according to the first exemplary embodiment of the present invention includes the plurality of virtual unit areas UA that are arranged in a matrix form. As described above, each of the unit areas UA may be approximately a rectangle having the sides that extend in the row direction D1 and the column direction D2. FIG. 11 illustrates an example of where the unit area UA is approximately a square. The diagonal directions of each unit area UA include a first diagonal direction D3 and a second diagonal direction D4 that intersect each other, and in the case of the unit area UA that is a square, the first and second diagonal directions D3 and D4 may form approximately 45° or 135° with respect to the row direction D1 and the column direction D2.

Figure 3:
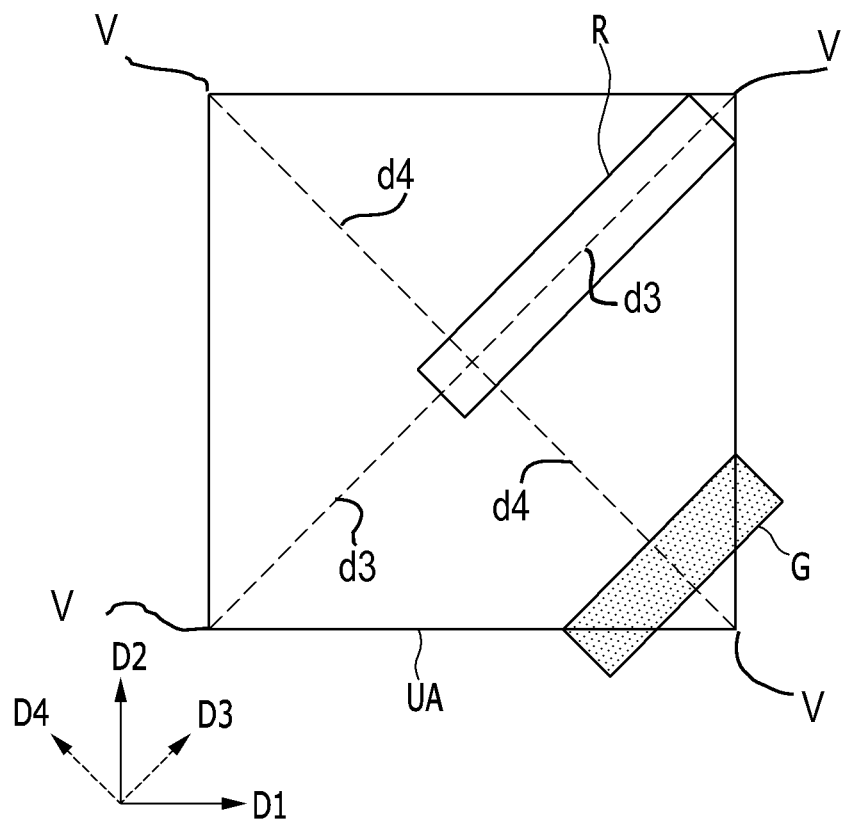
FIG. 3 illustrates a first unit area F3 according to a first embodiment of the present invention.
Figure 4:
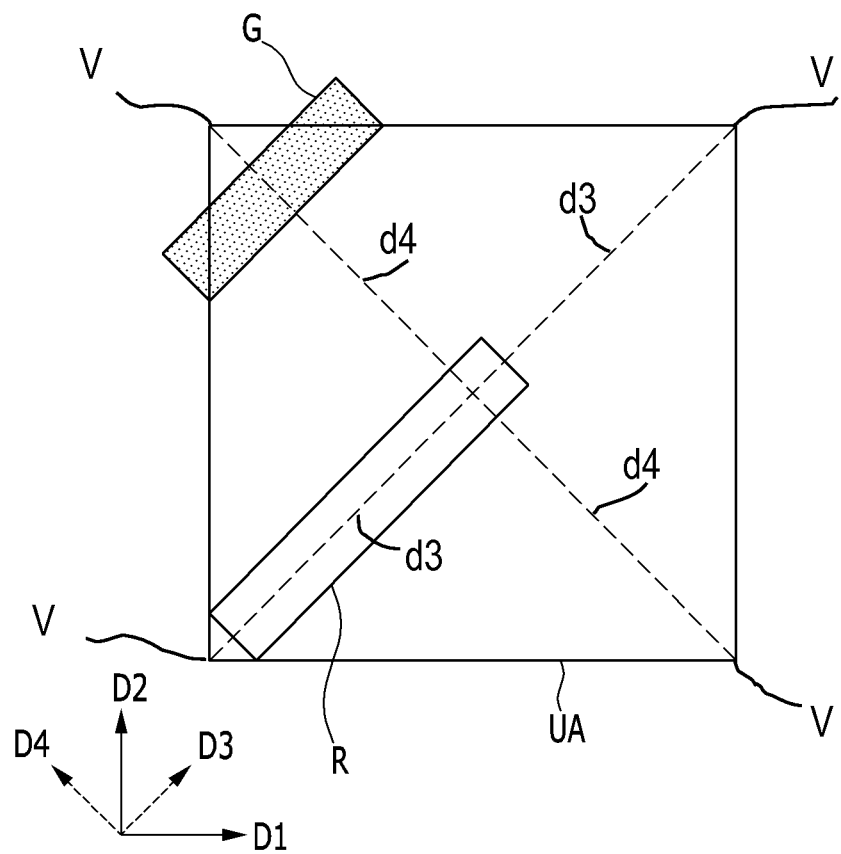
FIG. 4 illustrates a second unit area F4 according to the first embodiment of the present invention.
Figure 5:
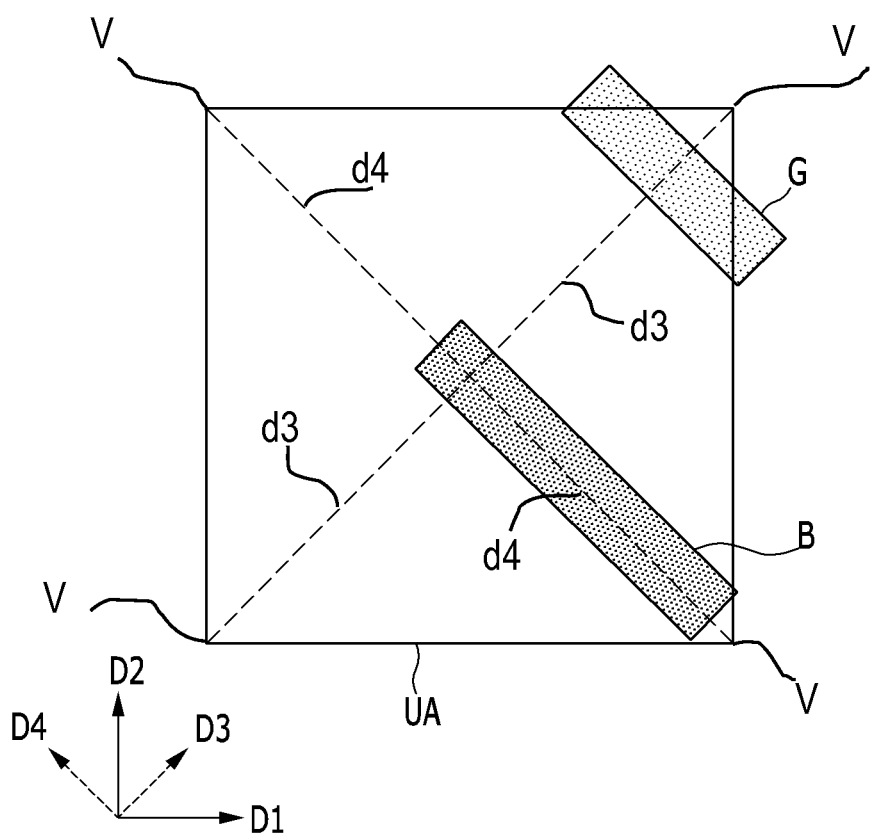
FIG. 5 illustrates a third unit area F5 according to the first embodiment of the present invention.
Figure 6:
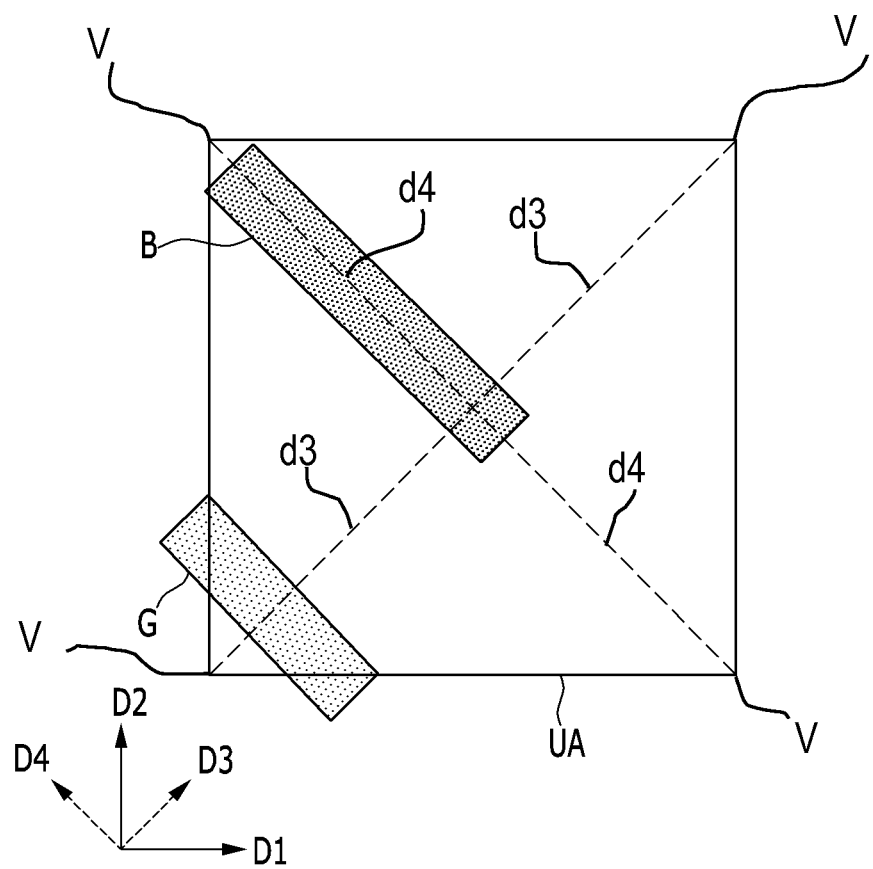
FIG. 6 illustrates a fourth unit area F6 according to the first embodiment of the present invention.
Figure 7:
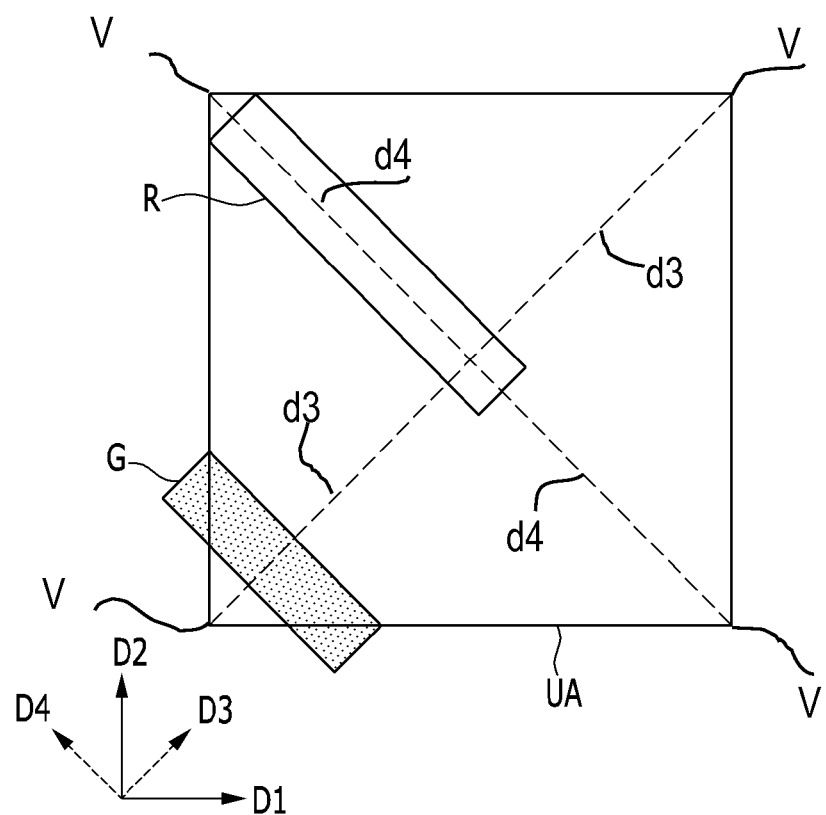
FIG. 7 illustrates a first unit area F7 according to a second embodiment of the present invention.
Figure 8:
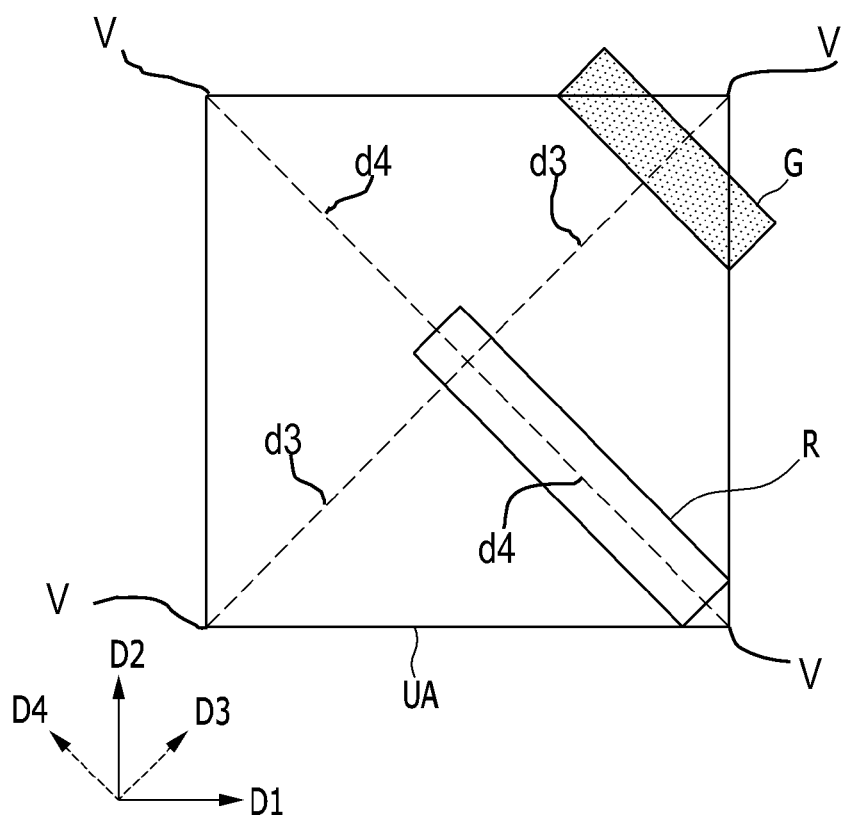
FIG. 8 illustrates a second unit area F8 according to the second embodiment of the present invention.
Figure 9:
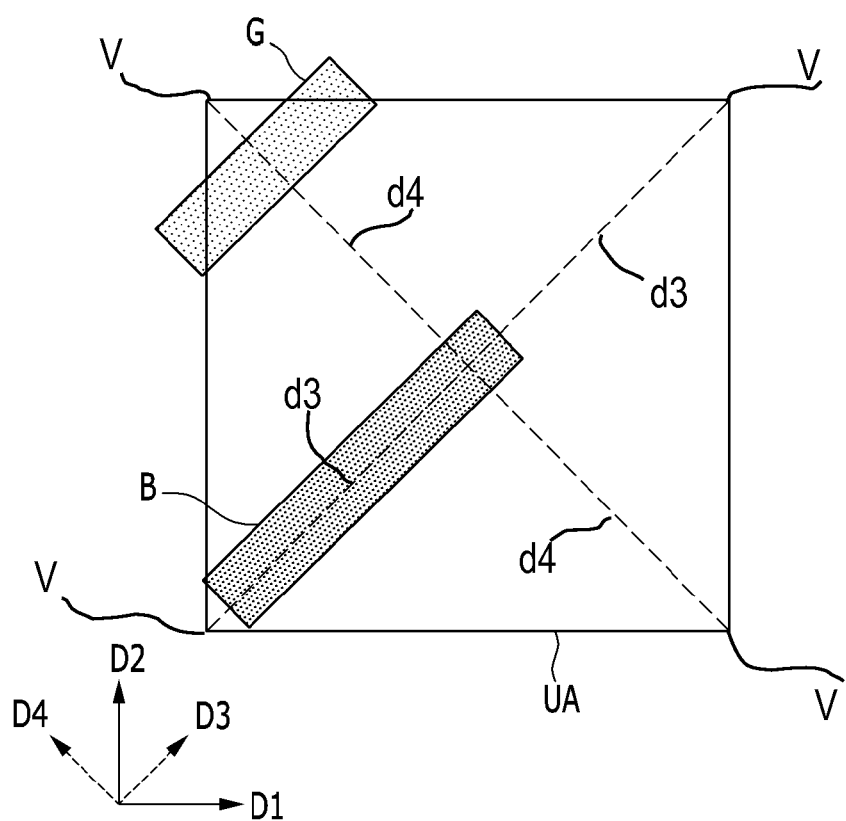
FIG. 9 illustrates a third unit area F9 according to the second embodiment of the present invention.
Figure 10:
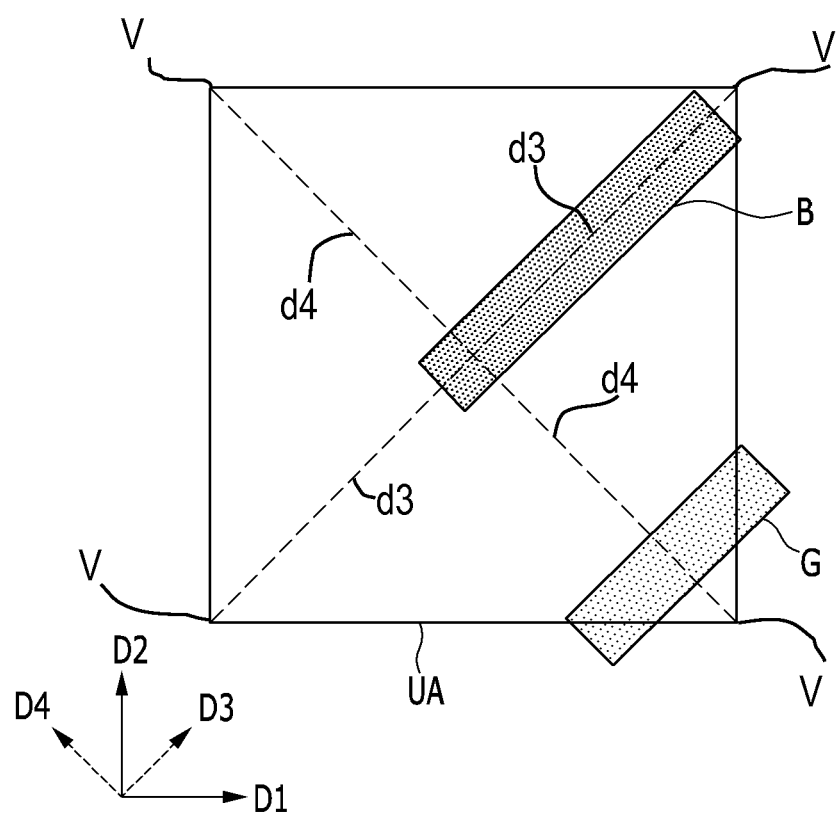
FIG. 10 illustrates a fourth unit area F10 according to the second embodiment of the present invention.

According to the exemplary embodiment of the present invention, the unit areas F3 and F5 illustrated in FIGS. 3 and 5 respectively are alternately arranged along the first and third rows in direction D1, and the unit areas F4 and F6 illustrated in FIGS. 4 and 6 respectively are alternately arranged along the second and third rows in the row direction D1. Further, the unit areas F3 and F6 illustrated in FIGS. 3 and 6 respectively are alternately arranged in the column direction D2 along the first and third columns, and the unit areas F4 and F5 illustrated in FIGS. 4 and 5 respectively are alternately arranged in the column direction D2 in the second and fourth columns. Therefore, the two unit areas F3 and F4 illustrated in FIGS. 3 and 4 respectively are adjacent to each other in the first diagonal direction D3, and the two unit areas F5 and F6 illustrated in FIGS. 5 and 6 respectively are adjacent to each other in the second diagonal direction D4.

All the long sides of the red pixels R may be arranged in parallel the first diagonal direction D3, and all the long sides of the blue pixels B may be arranged in parallel the second diagonal direction D4. The red pixels R of the two unit areas UA that are adjacent to each other in the first diagonal direction D3 and share a vertex V may be adjacent to each other and extend along a same diagonal line d3 by being disposed to be close to the vertex V where the two unit areas UA meet each other. Distances between the two red pixels R adjacent to each other, having the vertex V disposed therebetween and the vertex V between the two red pixels R may be approximately the same, and the two red pixels R may be symmetrical to each other with respect to the vertex V.

Similarly, the blue pixels B of the two unit areas UA that are adjacent to each other in the diagonal direction D4 and share one vertex V may be adjacent to each other and extend along a same diagonal line d4 by being disposed to be close to the vertex V where the two unit areas UA meet each other. Distances between the two blue pixels B adjacent to each other, having the vertex V disposed therebetween, and the vertex V between the two blue pixels B may be approximately the same and the two blue pixels B may be symmetrical to each other with respect to the vertex V.

The distance between the centers of the two red pixels R adjacent to each other in the row direction D1 or the column direction D2 may be approximately 100 μm or less, but is not limited thereto, and may vary depending on the resolution of the organic light emitting diode display.

The green pixels G of the two unit areas UA that are adjacent to each other in a diagonal direction may be adjacent to each other and extend in parallel each other by being disposed to be close to a vertex V where the two unit areas UA meet each other. Distances between the two green pixels G adjacent to each other, having the vertex V disposed therebetween and the vertex V between the two green pixels G may be approximately the same, and the two green pixels G may be symmetrical to each other with respect to the vertex V. According to the exemplary embodiment of the present invention, a pair of green pixels G that are parallel each other, having the vertex V disposed therebetween, may be far away from the red pixel R or the blue pixel B adjacent thereto, if possible.

The green pixel G inclined in the first diagonal direction D3 and the green pixel G inclined in the second diagonal direction D4 in one column or one row may be alternately arranged. The distance between the two green pixels G adjacent to each other in the row direction D1 or the column direction D2 may be approximately 100 μm or less, but is not limited thereto and may vary depending on the resolution of the organic light emitting diode display.

According to the pixel array structure according to the exemplary embodiment of the present invention, since the long side of each pixel R, G, and B is aligned according to the diagonal directions of the unit areas UAs, spatial use may be maximized and optimized by using the diagonal directions where the length is longest in the unit area UA.

Therefore, a margin to increase the aperture ratios of the pixels R, G, and B may be generated by securing the sufficient gap among the pixels R, G, and B, while the high resolution of the organic light emitting diode display may be easily implemented. Further, when the aperture ratios of the pixels R, G, and B are increased, the lifespan of the emission layers 373R, 373G, and 373B may be increased, such that the display quality of the organic light emitting diode display may be improved.

Further, since the pixels R, G, and B that are adjacent to each other and have the same color may be arranged as close as possible, the pixels R, G, and B that are adjacent and close to each other and have the same color may be deposited through the same opening of a fine metal mask FMM, such that the aperture ratios of the pixels R, G, and B may be maximized. Further, the fine metal mask according to the pixel array structure according to the exemplary embodiments of the present invention is more easily manufactured than the fine metal mask of the related art where the openings are formed in row or column directions for each pixel R, G, and B.

When the pixels having any one color are arrayed as a stripe in the row direction or the column direction as in the related art, the opening of the fine metal mask for depositing the emission layer is elongated and narrow in the column direction or the row direction, such that the deposition reliability may be reduced. However the fine metal mask used to deposit the emission layers 373R, 373G, and 373B of the organic light emitting diode display according to the exemplary embodiments of the present invention include openings of a dot type to increase the deposition reliability, the size of the panel of the organic light emitting diode display may be easily expanded.

Figure 12:
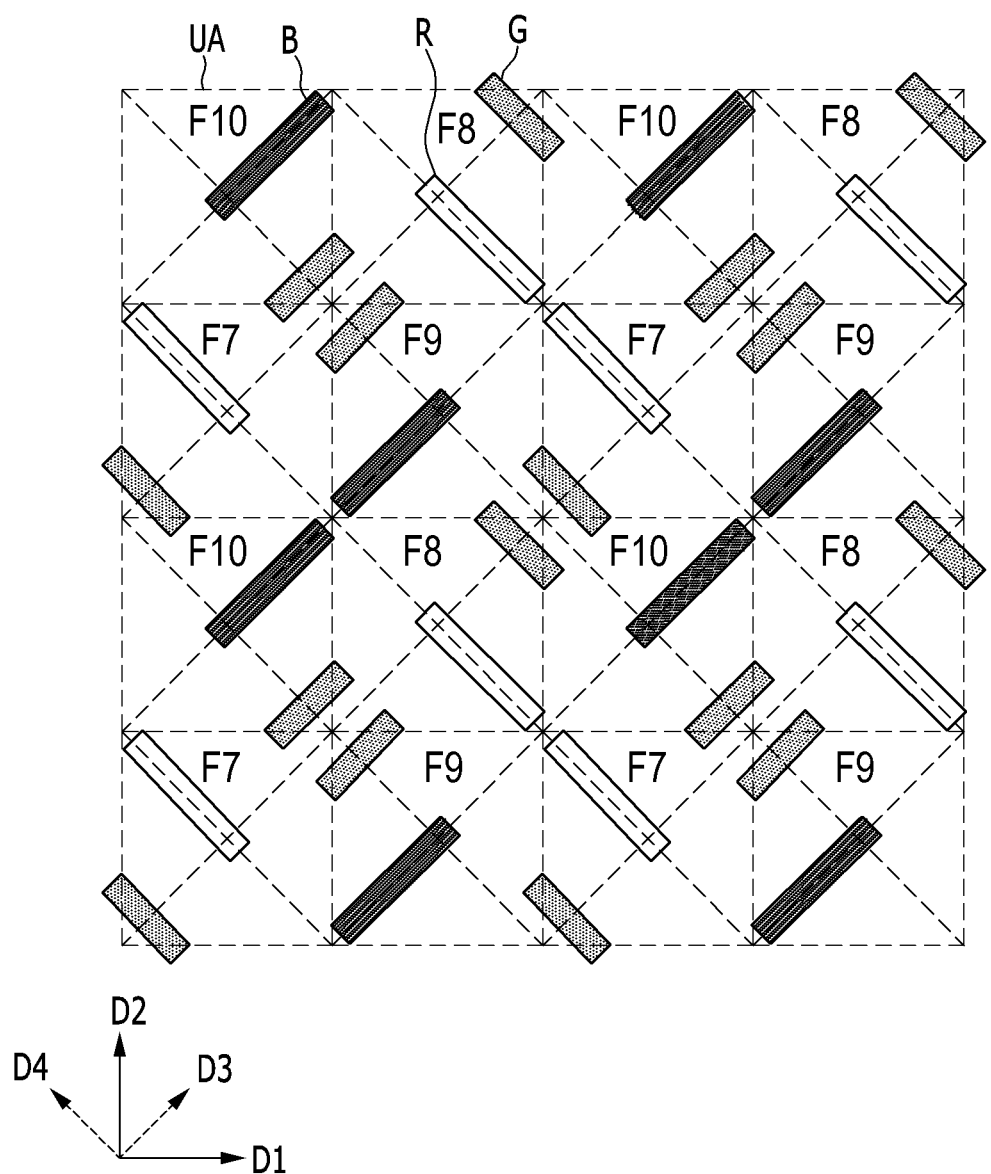
FIG. 12 is a plan view illustrating the pixel array structure of the organic light emitting diode display according to the second exemplary embodiment of the present invention using the unit areas of FIGS. 7 to 10.

Next, the pixel array structure of the organic light emitting diode display according to the second exemplary embodiment of the present invention will be described with reference to FIG. 12. FIG. 12 is a plan view of the pixel array structure of the organic light emitting diode display according to the second exemplary embodiment of the present invention, and includes the unit areas UA's F7, F8, F9 and F10 of FIGS. 7 to 10 respectively in a matrix form.

Referring to FIG. 12, the pixel array structure of the organic light emitting diode display according to the second exemplary embodiment of the present invention is substantially the same as the pixel array structure of the organic light emitting diode display according to the first exemplary embodiment of the present invention illustrated in FIG. 11 described above, except that the red pixel R and the blue pixel B may be interchanged with each other. That is, the pixel array structure of the organic light emitting diode display according to the second exemplary embodiment of the present invention may be the same as the structure obtained by rotating the pixel array structure according to the first exemplary embodiment of the present invention illustrated in FIG. 11 clockwise or counterclockwise. In FIG. 12, all the long sides of the red pixels R may be arranged in parallel the second diagonal direction D4, and all the long sides of the blue pixels B may be arranged in parallel the first diagonal direction D3.

Next, the pixel array structure of the organic light emitting diode display according to the third exemplary embodiment of the present invention will now be described with reference to FIG. 13.

Figure 13:
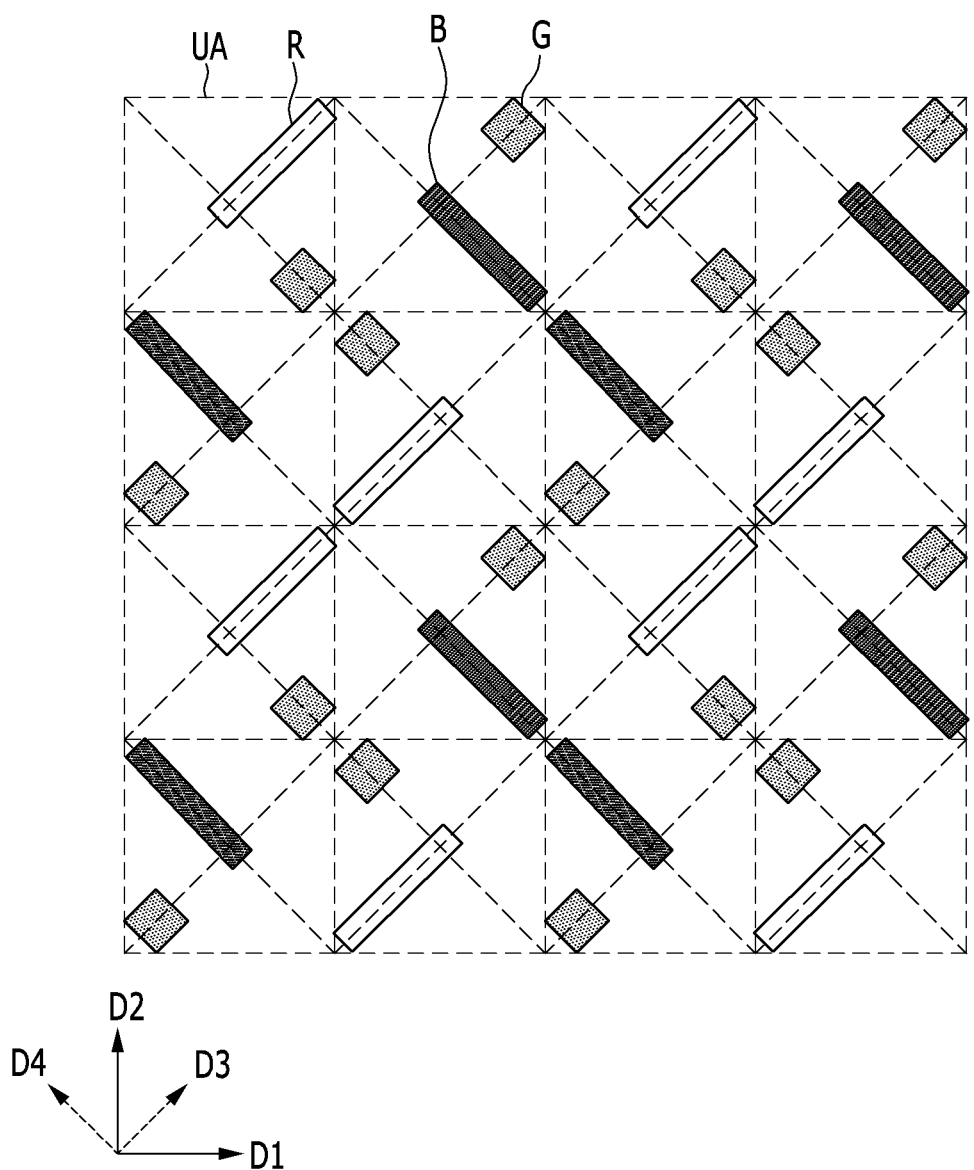
FIG. 13 is a plan view illustrating the pixel array structure of the organic light emitting diode display according to a third exemplary embodiment of the present invention.

FIG. 13 is a plan view of the pixel array structure of the organic light emitting diode display according to the exemplary embodiment of the present invention. Referring to FIG. 13, the pixel array structure of the organic light emitting diode display according to the third exemplary embodiment of the present invention is substantially the same as the pixel array structure of the organic light emitting diode display according to the first exemplary embodiment of the present invention illustrated in FIG. 11 described above, except that the shape of the green pixel G may be different.

The green pixel G in FIG. 13 may be a regular polygon instead of the polygon that has a longer length in any one direction than in another direction. FIG. 13 illustrates an example where the green pixel G is a square. In this case, the sides of the two green pixels G that is adjacent to each other, having a vertex V of the unit area UA disposed therebetween, may meet or may not meet the sides of the unit area UA. The area of the green pixel G of the organic light emitting diode display according to the first exemplary embodiment of the present invention illustrated in FIG. 11 described above may be approximately the same as or different from the area of the green pixel G according to the third exemplary embodiment of the present invention of FIG. 13.

According to the third exemplary embodiment of the present invention, the sides of the green pixel G may be approximately parallel or approximately perpendicular to the long side of the red pixel R or the blue pixel B that is disposed in the same unit area UA. Even in the third exemplary embodiment of the present invention, the distance between the green pixels G of the two unit areas UA that are adjacent to each other in a row direction D1 or a column direction D2 may be approximately 100 μm or less.

Figure 14:
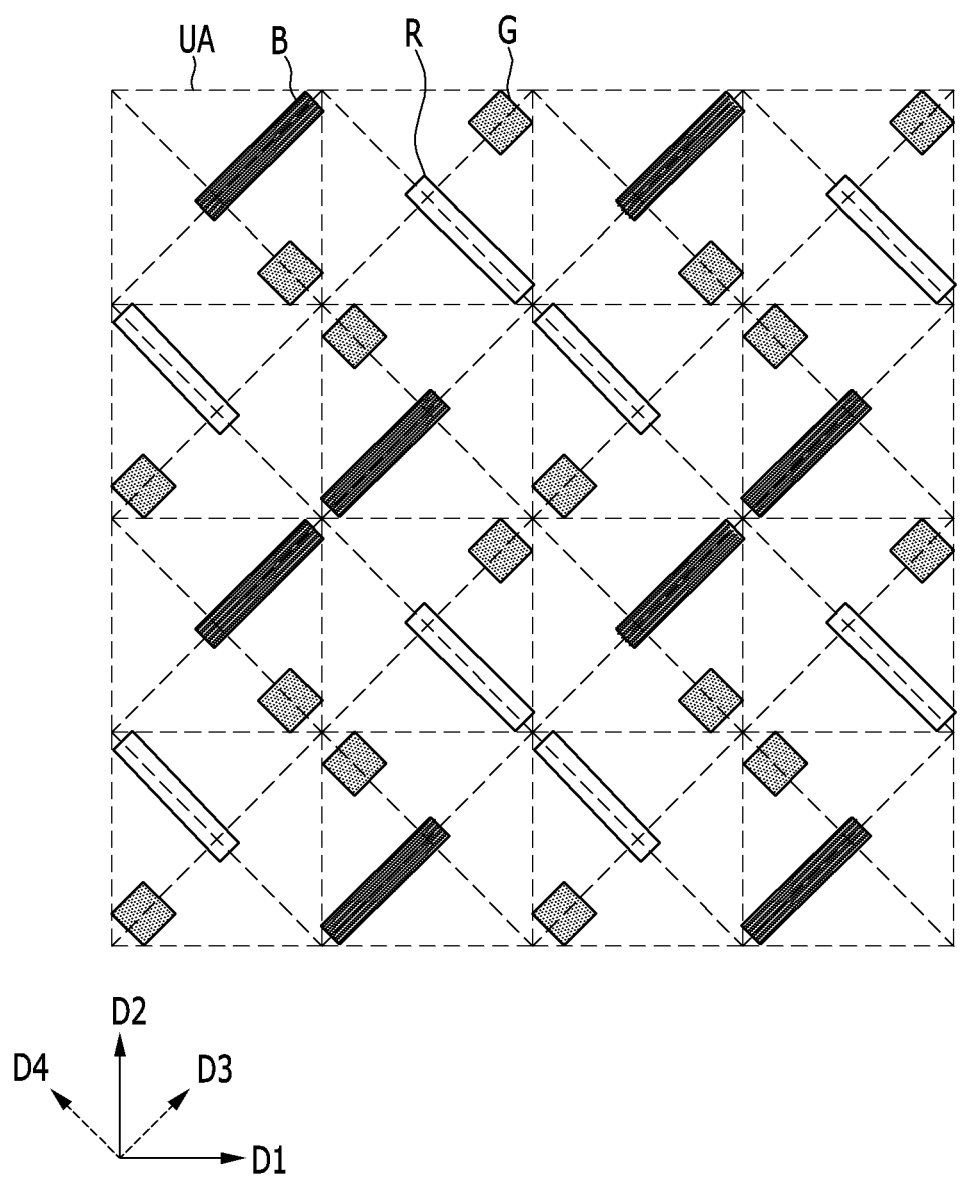
FIG. 14 is a plan view illustrating the pixel array structure of the organic light emitting diode display according to a fourth exemplary embodiment of the present invention.

Next, the pixel array structure of the organic light emitting diode display according to a fourth exemplary embodiment of the present invention will be described with reference to FIG. 14. FIG. 14 is a plan view of the pixel array structure of the organic light emitting diode display according to the fourth exemplary embodiment of the present invention.

Referring to FIG. 14, the pixel array structure of the organic light emitting diode display according to the fourth exemplary embodiment of the present invention is substantially the same as the pixel array structure of the organic light emitting diode display according to the third exemplary embodiment of the present invention illustrated in FIG. 13 described above, except that the orientation directions of the red pixels R and the blue pixels B may be interchanged with each other. That is, the pixel array structure of the organic light emitting diode display according to the fourth exemplary embodiment of the present invention may be the same as the structure obtained by rotating the pixel array structure of the third exemplary embodiment of the present invention illustrated in FIG. 13 clockwise or counterclockwise. Explained another way, the pixel array structure of the organic light emitting diode display according to the fourth exemplary embodiment of the present invention of FIG. 14 is substantially the same as the pixel array structure of the organic light emitting diode display of the second exemplary embodiment of the present invention illustrated in FIG. 12 described above, except that the shape of the green pixel G may be different.

It is to further be appreciated that the present invention is not limited to just the above four exemplary embodiments. For example, the above four embodiments can be modified by, for example interchanging the green pixels G and the red pixels R, or by interchanging the green pixels G and the blue pixels B, and still be within the scope of the present invention.

Hereinafter, a method for manufacturing an organic light emitting diode display according to an exemplary embodiment of the present invention will be described with reference to FIGS. 15 to 17, along with the above-mentioned drawings.

Figure 15:
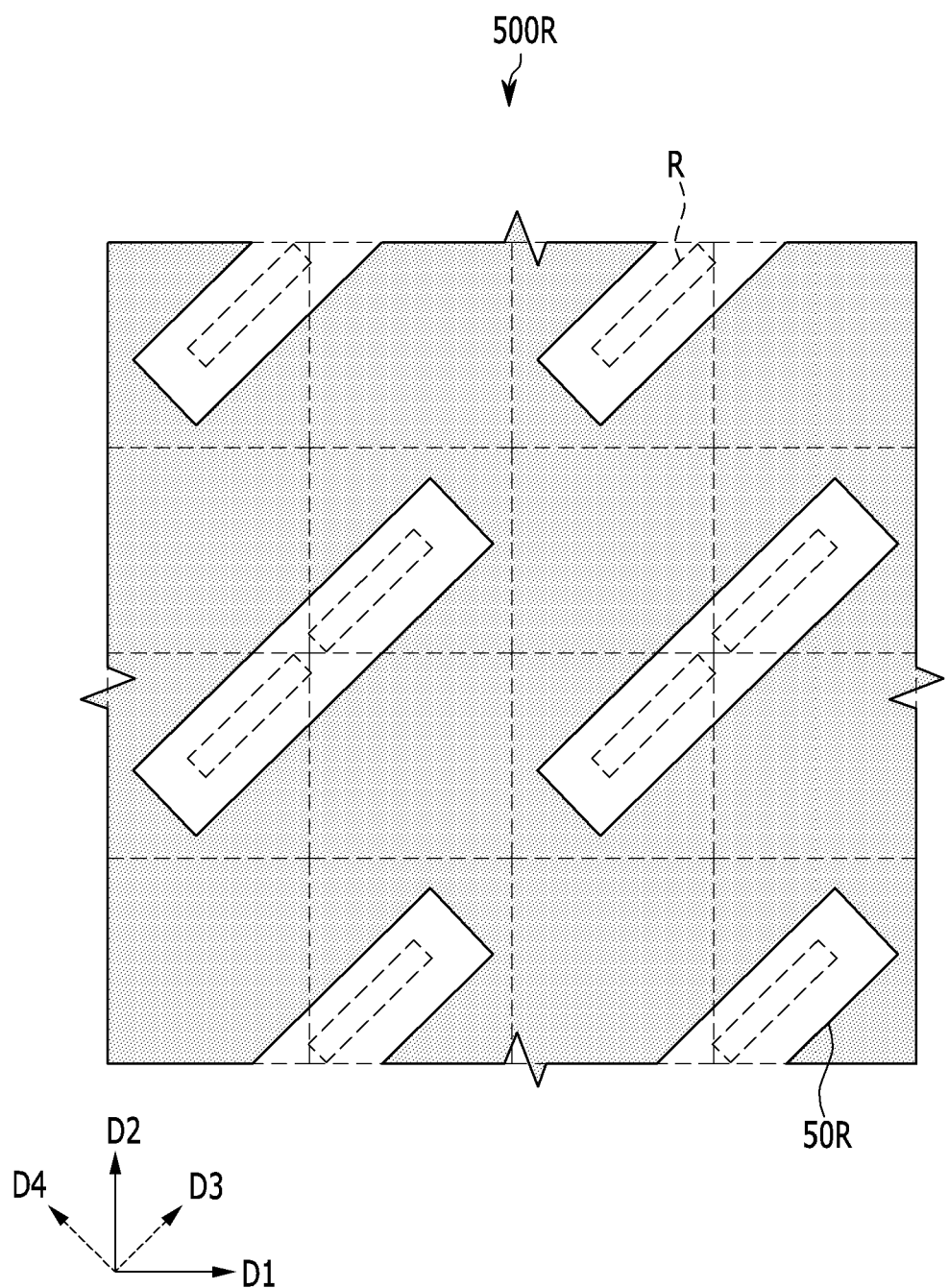
FIGS. 15 to 17 each are plan views illustrating an opening of a fine metal mask for depositing an emission layer of the organic light emitting diode display according to the first exemplary embodiment of the present invention.
Figure 16:
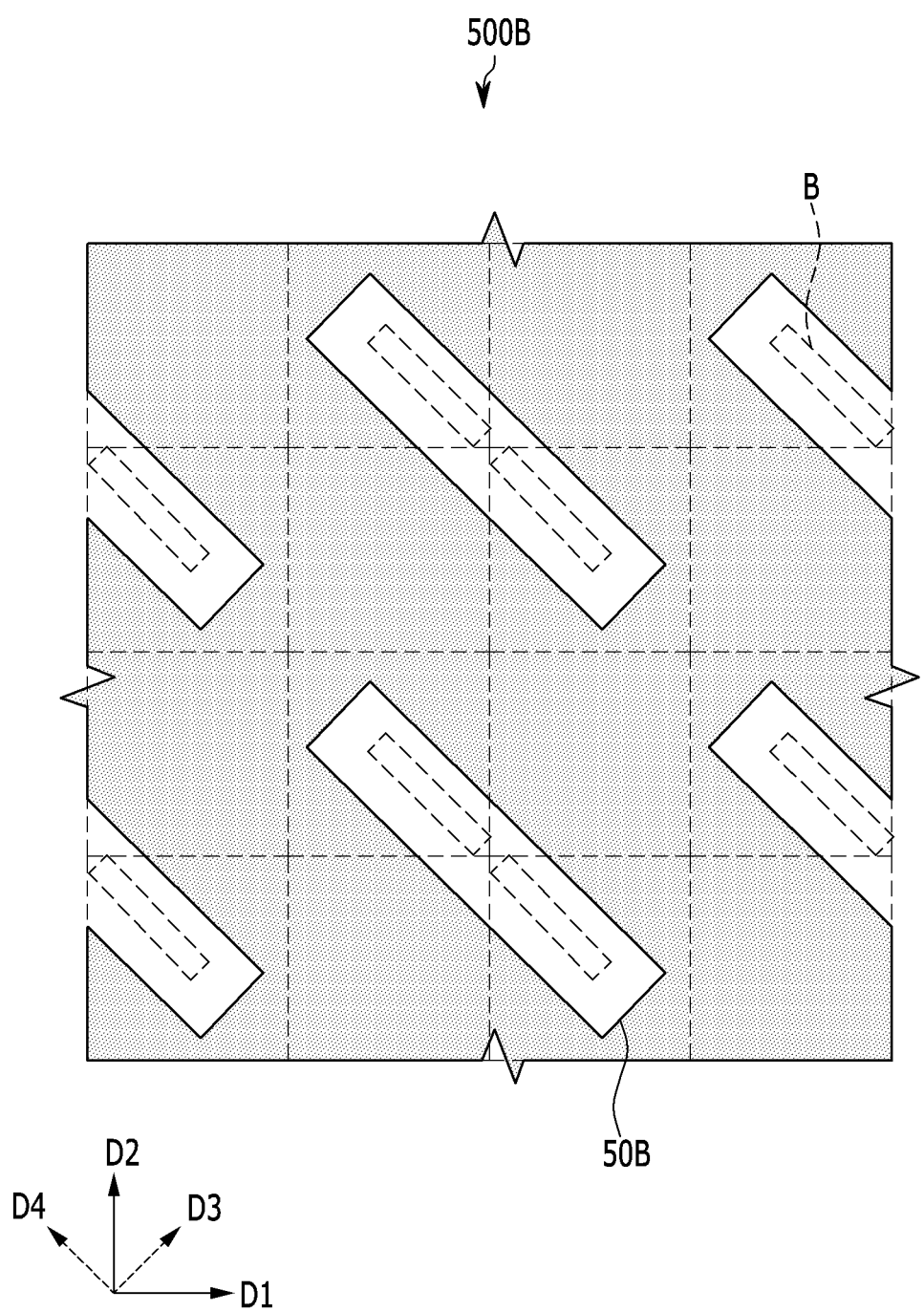
Figure 17:
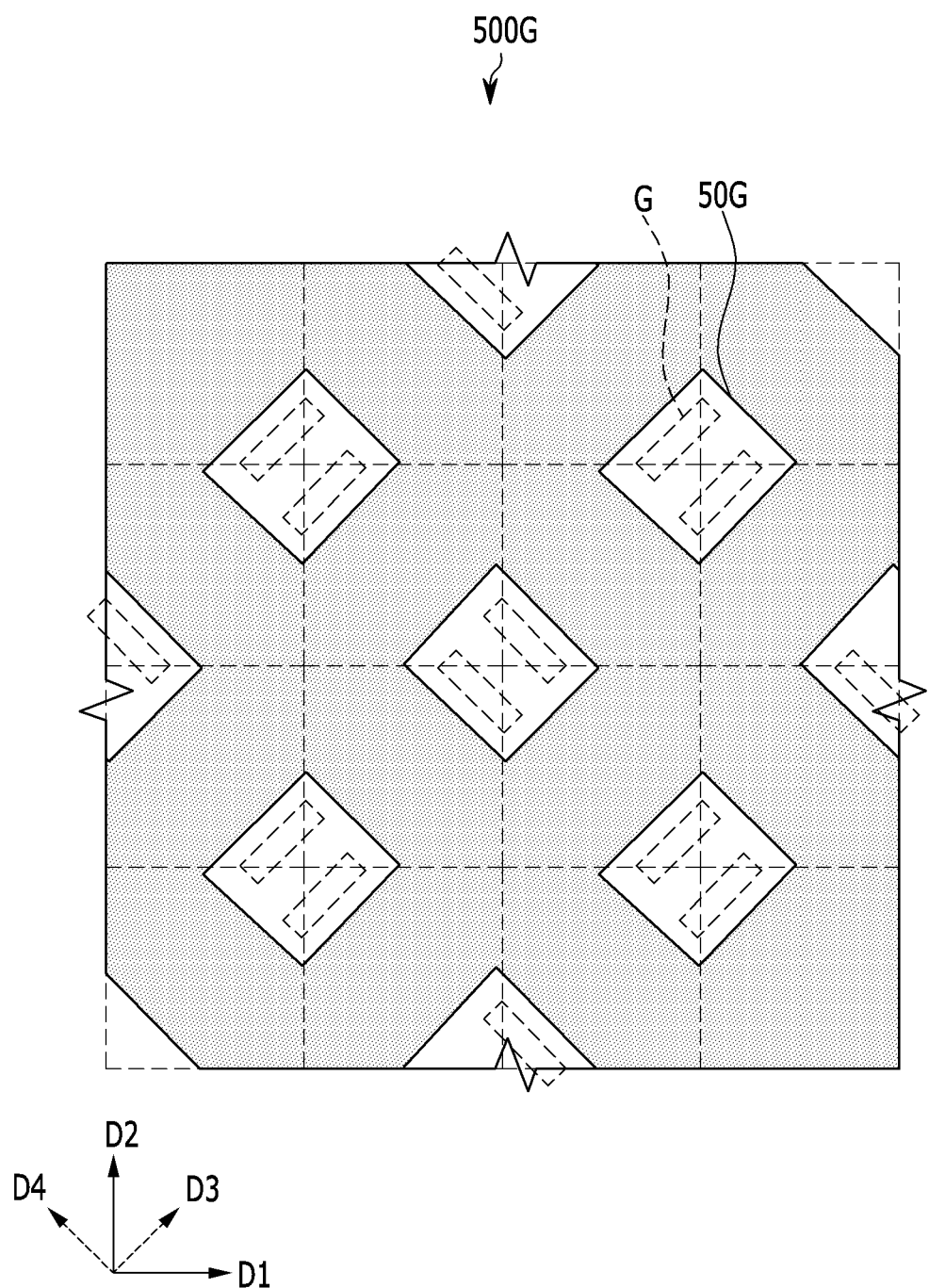

FIGS. 15 to 17 each are plan views illustrating an opening of a fine metal mask for depositing an emission layer of the organic light emitting diode display according to the first exemplary embodiment of the present invention to produce the arrangements of FIGS. 3 to 6 and 11.

Referring now to FIG. 2 described above, the plurality of driving transistors Qd are formed on the insulating substrate 110, and the passivation layer 180 having the plurality of contact holes 185 is formed by stacking and patterning the organic insulating material or the inorganic insulating material thereon. Next, the plurality of pixel electrodes 191, that is disposed in each of the pixels R, G, and B, are formed by stacking and patterning the conductive material on the passivation layer 180 for each of the pixels R, G, and B. Next, the pixel defining layer 360 having the plurality of openings to expose the plurality of pixel electrodes 191 is formed by stacking and patterning a polyacrylate resin, a polyimide resin, silica-based inorganic materials, or the like on the pixel electrode 191 and the passivation layer 180. Next, the lower organic common layer 371 is formed by depositing the organic material on the pixel defining layer 360 and the pixel electrode 191.

Next, the plurality of emission layers 373R, 373G, and 373B are formed by depositing the organic emission materials in the areas corresponding to the pixel electrodes 191 of each of the pixels R, G, and B. The red emission layer 373R according to the exemplary embodiment of the present invention may be deposited by using a fine metal mask 500R illustrated in FIG. 15. In the organic light emitting diode display according to various exemplary embodiments of the present invention described above, the fine metal mask 500R includes openings 50R, each opening 50R corresponding to the two red pixels R that are directly adjacent to each other that have the vertex of the unit area UA disposed therebetween. A size of the opening 50R may be larger than that of the two red pixels R, and an edge side of the opening 50R may be disposed outside the edge sides of the corresponding two red pixels R.

The fine metal mask 500R is disposed on the insulating substrate 110 where the lower organic common layer 371 has been formed, and the red emission layer 373R is formed by depositing a red emission material through the openings 50R.

Therefore, the pair of red pixels R that is directly adjacent to each other and having the vertex of the unit area UA disposed therebetween may be deposited through the same single opening of the fine metal mask 500R at a same time, such that the aperture ratio of the red pixel R may be maximized. Further, the fine metal mask according to the pixel array structure according to the exemplary embodiment of the present invention is more easily manufactured than the fine metal mask in the related art where the openings are formed for each pixel R, G, and B. Further, the fine metal mask 500R used to deposit the red emission layer 373R of the organic light emitting diode display according to the exemplary embodiment of the present invention includes opening 50R of the dot type, such that the deposition reliability may be increased, thereby easily expanding the size of the panel of the organic light emitting diode display.

The red emission layer 373R of the organic light emitting diode display according to various exemplary embodiments of the present invention illustrated in FIG. 12 or 14 may also be deposited by using the fine metal mask including the openings 50R corresponding to the two red pixels R that are directly adjacent to each other and having the vertex of the unit area UA disposed therebetween.

The blue emission layer 373B according to the exemplary embodiment of the present invention may be deposited by using a fine metal mask 500B illustrated in FIG. 16. In the organic light emitting diode display according to various exemplary embodiments of the present invention described above, the fine metal mask 500B includes openings 50B corresponding to the two blue pixels B that are directly adjacent to each other, having the vertex of the unit area UA disposed therebetween. A size of the opening 50B may be larger than that of the two blue pixels B, and an edge side of the opening 50B may be disposed outside the edge sides of the corresponding two blue pixels B.

The fine metal mask 500B is disposed on the insulating substrate 110 that the lower organic common layer 371 has been formed, and the blue emission layer 373B is formed by depositing a blue emission material through the opening 50B.

Therefore, the pair of blue pixels B that is directly adjacent to each other, having the vertex of the unit area UA disposed therebetween may be deposited through the same opening 50B of the fine metal mask 500B at a same time, such that the aperture ratio of the blue pixel B may be maximized. Further, the fine metal mask according to the pixel array structure according to the exemplary embodiments of the present invention is more easily manufactured than the fine metal mask of the related art where the openings are formed for each pixel R, G, and B. Further, the fine metal mask 500B used to deposit the blue emission layer 373B of the organic light emitting diode display according to the exemplary embodiments of the present invention includes the opening 50B of the dot type, such that the deposition reliability may be increased, thereby easily expanding the size of the panel of the organic light emitting diode display.

The blue emission layer 373B of the organic light emitting diode display according to various exemplary embodiments of the present invention illustrated in FIG. 12 or 14 may also be deposited by using the fine metal mask including the openings 50B, each opening 50B corresponding to two blue pixels B that are directly adjacent to each other, having the vertex of the unit area UA disposed therebetween.

The green emission layer 373G according to the exemplary embodiment of the present invention may be deposited by using a fine metal mask 500G illustrated in FIG. 17. In the organic light emitting diode display according to various exemplary embodiments of the present invention described above, the fine metal mask 500G includes openings 50G corresponding to the two green pixels G that are directly adjacent to each other, having the vertex of the unit area UA disposed therebetween. A size of the opening 50G may be larger than that of the two green pixels G, and an edge side of the opening 50G may be disposed outside the edge sides of the corresponding two green pixels G.

The fine metal mask 500G is disposed on the insulating substrate 110 where the lower organic common layer 371 has been formed, and the green emission layer 373G is formed by depositing a green emission material through the opening 50G.

Therefore, the pair of the green pixels G that is directly adjacent to each other, having the vertex of the unit area UA disposed therebetween may be deposited through the same opening 50G of the fine metal mask 500G at a same time, such that the aperture ratio of the green pixel G may be maximized. Further, the fine metal mask according to the pixel array structure according to the exemplary embodiment of the present invention is more easily manufactured than the fine metal mask of the related art where the openings are formed for each pixel R, G, and B. Further, the fine metal mask 500G used to deposit the green emission layer 373G of the organic light emitting diode display according to the exemplary embodiment of the present invention includes openings 50G of the dot type, such that the deposition reliability may be increased, thereby easily expanding the size of the panel of the organic light emitting diode display.

The green emission layer 373G of the organic light emitting diode display according to various exemplary embodiments of the present invention illustrated in FIG. 12 or 14 may also be deposited by using the fine metal mask where each openings 50G corresponds to two green pixels G that are directly adjacent to each other, having the vertex of the unit area UA disposed therebetween.

In the present invention, by arranging the pixels in a diagonal direction, it can be effective in using the space, thereby improving the aperture ratio. The opening of the fine metal mask (FMM) of the present invention corresponds to the pixels. In addition, at least a minimal gap between the pixel defining layers is required in consideration of the characteristics of the FMM. According to the present invention, the organic layer corresponding to adjacent pixels can be deposited through a same opening in the FMM, so that the gap between the openings can be reduced compared to the case when each opening corresponding to each pixel is formed in the FMM, and accordingly, the aperture ratio can be further improved.

Also, the object deposited using the FMM is the organic layer such as the light emission layer. Even though the organic layer is deposited on a pair of pixels for each opening in the FMM, the pixels in a pair are not connected to each other.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

110: Insulating substrate
121: Scanning signal line
171: Data line
172: Driving voltage line
180: Passivation layer
185: Contact hole
191: Pixel electrode
270: Common electrode
360: Pixel defining layer
371, 375: lower, upper organic common layer
373R, 373G, 373B: Emission layer
500R, 500G, 500B: Fine metal mask
50R, 50B, 50G: Openings in fine metal mask

What is claimed is:

1. An organic light emitting diode display, comprising:
a plurality of pixels of a first color, a plurality of pixels of a second color, and a plurality of pixels of a third color arrayed based on a plurality of virtual unit areas arranged in a matrix, the matrix also including a plurality of vertexes, each vertex being arranged at where corners of adjoining unit areas meet,
wherein each unit area has a rectangular shape having a plurality of sides, each of the sides being approximately parallel to one of a row direction and a column direction,
wherein a first of the pixels of the first color being arranged in a first of the unit areas and being arranged to be closest to a first vertex that is one of two vertexes that a first diagonal line extending in a first diagonal direction of the first of the unit areas intersects
wherein a second of the pixels of the first color being arranged in a second of the unit areas, the second of the unit areas being adjacent to the first of the unit areas in the first diagonal direction, wherein the first vertex being arranged in between the first and the second of the pixels of the first color,
wherein each of the first and the second of the pixels of the first color having a polygonal shape having long sides aligned according to the first diagonal direction,
wherein a first of the pixels of the second color being arranged in a third of the unit areas and being arranged closest to a second vertex that is one of two vertexes that a second diagonal line of the third of the unit areas intersects, the second diagonal line extending in a second diagonal direction that is a different from the first diagonal direction,
wherein a second of the pixels of the second color being arranged in a fourth of the unit areas, the fourth of the unit areas being adjacent to the third of the unit areas in the second diagonal direction, wherein the second vertex being arranged in between the first and the second of the pixels of the second color, and
wherein the first and the second of the pixels of the second color being a polygon having long sides aligned according to the second diagonal direction.

2. The organic light emitting diode display of claim 1, wherein each of the unit areas comprise only two differently colored pixels within, wherein each of the two differently colored pixels have at least a portion of said pixel within the unit area.

3. The organic light emitting diode display of claim 1, wherein the first and the second of the pixels of the first color that share the first vertex are symmetrical to each other with respect to the shared first vertex.

4. The organic light emitting diode display of claim 1, wherein the first and the second of the pixels of the second color that share the second vertex are symmetrical to each other with respect to the shared second vertex.

5. The organic light emitting diode display of claim 1, wherein a first pixel of the third color is arranged in the first of the unit areas and is adjacent to a third vertex that is one of two vertexes that a third diagonal line of the first of the unit areas intersects, the third diagonal line extending in the second diagonal direction.

6. The organic light emitting diode display of claim 5, wherein the first of the pixels of the third color is a polygon that has a long side that extends substantially parallel to the first diagonal direction.

7. The organic light emitting diode display of claim 6, wherein longitudinal directions of differing pixels of the third color arranged in unit areas that are adjacent in the row direction or the column direction are different from each other.

8. The organic light emitting diode display of claim 5, wherein the first of the pixels of the third color is a regular polygon that has a side substantially parallel the first diagonal direction.

9. The organic light emitting diode display of claim 5, wherein a second of the pixels of the third color is arranged in a third of the unit areas while being adjacent to the first of the pixels of the third color while sharing a same third vertex, the first and the second of the pixels of the third color being symmetrical to each other with respect to the shared third vertex.

10. The organic light emitting diode display of claim 1, wherein at least one of a distance between two of the pixels of the first color that are adjacent to each other in a row direction or a column direction, a distance between two of the pixels of the second color that are adjacent to each other in a row direction or a column direction, and a distance between two of the pixels of the third color that are adjacent to each other in a row direction or a column direction is approximately 100 µm or less.

11. The organic light emitting diode display of claim 1, wherein one of the pixels of the third color and one of the pixels of either the first or the second color are arranged in each of the unit areas, wherein the pixels of the third color is are green pixels.

12. The organic light emitting diode display of claim 11, wherein a length of each of the pixels of the third color is approximately half of that of each of the pixels of the first color and the pixels of the second color.

13. An organic light emitting diode display, comprising:
a plurality of pixels of a first color, a plurality of pixels of a second color, and a plurality of pixels of a third color arrayed based on a plurality of virtual unit areas arranged in a matrix, the matrix also including a plurality of vertexes, each vertex being arranged at where corners of adjoining unit areas meet,
wherein each unit area has a rectangular shape having a plurality of sides, each of the sides being approximately parallel to one of a row direction and a column direction,
wherein a first of the pixels of the first color being arranged in a first of the unit areas and being arranged to be closest to a first vertex that is one of two vertexes that a first diagonal line extending in a first diagonal direction of the first of the unit areas intersects,
wherein a second of the pixels of the first color being arranged in a second of the unit areas, the second of the unit areas being adjacent to the first of the unit areas in the first diagonal direction, wherein the first vertex being arranged in between the first and the second of the pixels of the first color,
wherein each of the first and the second of the pixels of the first color having a polygonal shape having long sides aligned according to the first diagonal direction,
wherein a first of the pixels of the second color being arranged in a third of the unit areas and being arranged closest to a second vertex that is one of two vertexes that a second diagonal line of the third of the unit areas intersects, the second diagonal line extending in a second diagonal direction that is a different from the first diagonal direction,
wherein a second of the pixels of the second color being arranged in a fourth of the unit areas, the fourth of the unit areas being adjacent to the third of the unit areas in the second diagonal direction, wherein the second vertex being arranged in between the first and the second of the pixels of the second color, and
wherein the first and the second of the pixels of the second color being a polygon having long sides aligned according to the second diagonal direction,
a plurality of pixel electrodes formed on an insulating substrate for each of the plurality of pixels of the first color, for each of the plurality of pixels of the second color, and for each of the plurality of pixels of the third color;
a first emission layer formed on the pixel electrodes of the pixels of the first color by using a first fine metal mask; and
a common electrode formed on the first emission layer, wherein the first fine metal mask includes a first opening corresponding to a pair of the pixels of the first color that are adjacent to each other.

14. The organic light emitting diode display of claim 1, wherein only the first and the second pixels of the first color are shared by and are arranged in a vicinity of the first vertex.

15. The organic light emitting diode display of claim 2, wherein one of the two differently colored pixels is green, and the other of the two differently colored pixels is only one of red and blue.

16. The organic light emitting diode display of claim 2, wherein each of the unit areas includes more than half of a green pixel and more than half of only one of a blue pixel and a red pixel, wherein each of the green pixel and the only one of the blue pixel and the red pixel having long sides extending substantially parallel to a same diagonal direction.

17. The organic light emitting diode display of claim 1, each of the pixels of the first color, the second color and the third color have a rectangular shape and have a longest dimension extending along one of the first diagonal direction and a second diagonal direction that crosses the first diagonal direction.

18. The organic light emitting diode display of claim 1, each of the vertexes within a perimeter of a display area of the display have only two pixels of a same color arranged within, these two pixels being parallel to each other and being symmetric with respect thereto and in a vicinity thereof.

* * * * *